United States Patent [19]
Hamamoto et al.

[11] Patent Number: 5,140,184
[45] Date of Patent: Aug. 18, 1992

[54] CLOCK FEEDING CIRCUIT AND CLOCK WIRING SYSTEM

[75] Inventors: Masato Hamamoto, Ohme; Toshio Yamada, Hamura, both of Japan

[73] Assignee: Hitachi, Ltd., Tokyo, Japan

[21] Appl. No.: 615,930

[22] Filed: Nov. 20, 1990

[30] Foreign Application Priority Data

Dec. 7, 1989 [JP] Japan .................. 1-318572

[51] Int. Cl.⁵ .................................... H03K 19/177
[52] U.S. Cl. ................................ 307/303.1; 307/269;
328/55; 328/63; 328/72; 371/1; 375/118
[58] Field of Search ................ 371/1; 307/303.1, 269;
328/63, 72, 55; 375/118

[56] References Cited

U.S. PATENT DOCUMENTS

| | | | |
|---|---|---|---|
| 3,728,679 | 4/1973 | McIntosh | 371/1 |
| 4,337,433 | 6/1982 | Yoshimura | 328/55 |
| 4,479,216 | 10/1984 | Krambeck et al. | 307/269 |
| 4,755,704 | 7/1988 | Flora et al. | 328/55 |
| 4,760,290 | 7/1988 | Martinez | 307/269 |
| 4,860,322 | 8/1989 | Lloyd | 371/1 |

Primary Examiner—Stanley D. Miller
Assistant Examiner—Scott A. Ouellette
Attorney, Agent, or Firm—Fay, Sharpe, Beall, Fagan, Minnich & McKee

[57] ABSTRACT

Dummy power source wirings connected to a power source wiring are arranged in empty regions among the signal wirings that cross the clock wirings, the dummy power source wirings being arranged over or under the clock wirings in a manner to cross the clock wirings. The dummy power source wirings are formed to equalize the capacitances of the wirings whose lengths should be equalized among, for example, the clock distributing circuits or among the clock drivers.

8 Claims, 5 Drawing Sheets

CLOCK FEEDING CIRCUIT AND CLOCK WIRING SYSTEM

BACKGROUND OF THE INVENTION

The present invention relates to clock signal wirings in a semiconductor integrated circuit or in a circuit formed on a wiring substrate and to technology for feeding clock signals, and further relates to technology that can be effectively adapted to computers that operate at high speeds in synchronism, for instance, with clock signals.

In a synchronous sequence circuit which is operated in synchronism with the clock signals, it is essential that the clock signals are distributed at the same timing to each of the portions of the circuit operated in synchronism. If there is deviation in timing among the portions of the circuit, the data are no longer transferred in correct sequence among these portions. The deviation in the timing, i.e., the deviation in phase of the clock signals supplied to each of the portions, is called clock skew.

In order to minimize the clock skew, the clock signals sent to each of the portions from the clock generating circuit or from the clock input circuit should be uniformly delayed. In the semiconductor integrated circuits which are highly densely integrated or which have logics of a large scale, however, it is not easy to decrease the clock skew due to undesired capacitances stemming from unequal clock wiring lengths and upper or lower crossing wiring layers caused by the arrangement of internal circuits and various internal signal wirings. In particular, when a design method is employed such as a gate array system or a standard cell system using an automatic wiring program, the width of the clock wirings is minimized like that of other signal wirings, and great difficulty is involved to estimate resistance components and capacitive components in the clock wirings.

So far, therefore, there has been proposed technology to equalize the capacitances of the wirings by partially expanding the wiring pattern from the clock distributing circuit to each of the portions or by connecting extra wirings as required as has been disclosed in Japanese Patent Laid-Open No. 254633/1985. As disclosed in Japanese Patent Laid-Open No. 78611/1988, furthermore, there has been proposed technology to adjust the addition of wirings by inserting additional gates to those wirings that have short clock arrival times.

SUMMARY OF THE INVENTION

The above-mentioned prior art is directed to dealing with the individual clock wirings such as changing the wiring width or inserting additional gates depending upon the conditions of the individual clock wirings. It was discovered by the present inventors that according to the above prior art it is necessary to individually grasp and cope with even the capacitive components that undergo a change when, for example, signal wirings intersect the clock wirings, and complex processing operation is needed. It was further discovered through the study by the present inventors that when it is attempted to operate the circuit at high speeds, it becomes necessary to shorten the clock signal rising and breaking times accompanying the increase in the clock signal frequency and to decrease the allowable value of the clock skew as much as possible.

The object of the present invention is to provide a clock feeding circuit which is capable of decreasing the clock skew to meet an increase in the operation speed.

Another object of the present invention is to provide a clock wiring system which is capable of easily decreasing the clock skew maintaining high reliability.

The above and other objects as well as novel features of the present invention will become obvious from the description of the specification and the accompanying drawings.

Among the inventions disclosed in the present application, a representative example will now be briefly described below.

That is, dummy power source wirings connected to the power source wiring are arranged over or under the clock wirings to cross the clock wirings, the dummy power source wirings being arranged in empty regions among the signal wirings that cross the clock wirings. Such dummy power source wirings are formed when it is attempted to equalize the capacitances of the wirings whose lengths are desired to be equalized among the clock distributing circuits and among the clock drivers.

In order to easily equalize the lengths and capacitances of the clock wirings in the clock distributing circuit irrespective of the condition of its distribution, output signal lines of a plurality of input buffers and input signal lines of a plurality of output buffers should be arranged in a crossing manner, and predetermined input signal lines and output signal lines should be coupled together at required crossing positions to determine the condition for distributing the clock signals.

In order for the components to remain unchanged in the clock distributing circuit or in the clock output buffers having a common input and a plurality of emitter follower output circuits or source follower output circuits irrespective of the condition of using the output terminals, an electric current should be supplied even to the above-mentioned emitter follower output circuits or to the source follower circuits corresponding to the output terminals that are not being used.

In order to increase the clock transfer speed among the clock distributing circuits or among the clock buffers, it is desired that the clock signals are transferred in the form of differential signals.

When the dummy wirings are coupled to the clock signal lines in order to absorb differences in the length of the clock wirings, it is desired that the dummy wirings are arranged relatively close to the output terminals of the clock drivers.

Further, when the clock wirings are to be formed under the condition where there are arranged a first clock distributing circuit that distributes clock signals received from an external unit through clock input circuits, and a second clock distributing circuit which receives clock signals produced from the first clock distributing circuit and distributes them to required circuits, the clock skew can be easily decreased to meet an increase in the speed of operation provided the clock wirings are formed according to a method in which the second clock distributing circuit is arranged in each of the partial regions that are imaginarily divided from the whole circuit region in order to calculate the evaluation value of clock skew in each of the partial regions and, when the evaluation value is judged to be poor, the partial regions are further divided into smaller regions to evaluate again the value of clock skew, under the condition where the arrangements of said clock input circuits and said first clock distributing circuit have already been determined.

According to the above-mentioned means, the dummy power source wirings that are arranged crossing the clock wirings help equalize the capacitances among the clock wirings without being substantially affected by the number or the distribution condition of other signal wirings that cross the clock wirings whose lengths should be equalized among the clock distributing circuits and among the clock drivers.

Similarly, even in the clock distributing circuits, the vertical and lateral crossing input signal lines and output signal lines help equalize the lengths and capacitances of internal wirings based on the interaction irrespective of at which positions they are connected together.

The capacitive components that exist on the clock wirings can be regarded as a distributed capacity that exists along the paths thereof. Dummy wirings should be coupled to the clock signal lines in order to equalize the capacitances by absorbing the difference in the length of clock wirings. However, the dummy wirings do not substantially work as signal transfer paths. Therefore, with the dummy wirings being arranged relatively close to the output terminals of the clock drivers, the capacitive components increased by the dummy wirings so act upon the clock drivers as to relatively increase the delay components.

In a plurality of emitter follower output circuits or source follower output circuits having a common input, if the current paths of the circuits that are not used are cut off, then a change develops in the base currents and in the terminal voltages between the base and emitter capacitances in the remaining emitter follower output circuits, and a change further develops in the terminal voltage between the gate and source capacitances in the source follower circuits. Such changes affect the speed of change of the clock signals produced from the emitter follower output circuits or the source follower output circuits. Therefore, with an electric current being allowed to flow through the emitter follower output circuits or the source follower output circuits corresponding to the output terminals that are not being used, the delay components remain unchanged in the clock distributing circuits or in the clock output buffers irrespective of their output conditions.

With the clock signals being transferred as differential signals, the delay which is roughly one-half the delay of change of the individual non-inverted and inverted signals substantially serves as a delay of transfer which acts to increase the clock transfer speed among the clock distributing circuits and among the clock buffers.

When the clock wirings are formed while arranging a clock distributing circuit in their way, a clock wiring method is employed in which a clock distributing circuit of a latter stage is arranged in each of the partial regions imaginarily divided from the whole region of the circuit under the condition where the arrangement of the clock distributing circuit has been determined in the former stage, and the value of clock skew of each of the partial regions is evaluated and, as required, the partial region is further divided into small regions, in order to easily decrease the clock skew to meet an increase in the speed of operation.

DESCRIPTION OF THE PREFERRED EMBODIMENTS

Figure 1:
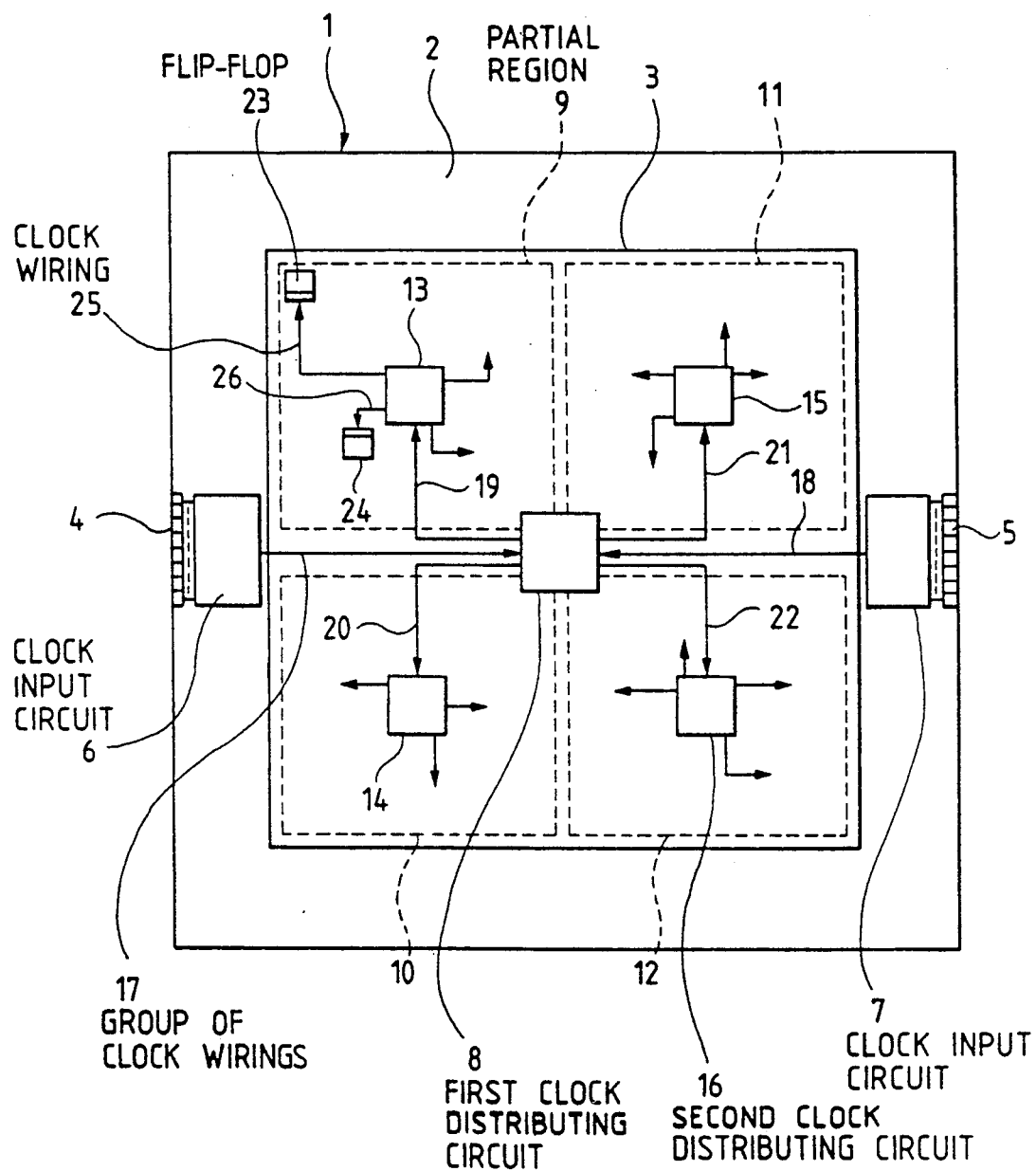
FIG. 1 is a diagram illustrating an embodiment of a semiconductor integrated circuit to which the present invention is adapted.

FIG. 1 shows a semiconductor integrated circuit according to an embodiment of the present invention.

In FIG. 1, reference numeral 1 denotes a semiconductor substrate such as of silicon, and a surrounding region 2 thereof permits external electrodes such as bonding pads and bump electrodes as well as input buffers and output buffers to be formed thereon, and a central portion thereof serves as a region 3 for forming required circuit cells.

Though there is no particular limitation, the semiconductor integrated circuit of this embodiment operates upon receipt of a clock signal from an external clock generator. FIG. 1 shows chiefly the clock feeding system wherein in the region 2 are arranged, for example, two groups of external clock input terminals 4, 5 and two clock input circuits 6, 7 corresponding thereto.

A first clock distributing circuit 8 is arranged at the center of the circuit cell-forming region 3 to distribute the clock signals received through the clock input circuits 6 and 7. In FIG. 1, the circuit cell-forming region 3 is imaginarily divided into four partial regions 9, 10, 11 and 12 with the first clock distributing circuit 8 as the center, and second clock distributing circuits 13, 14, 15 and 16 are arranged at the centers of the partial regions 9 to 12. Upon receipt of clock signals from the first clock distributing circuit 8, the second clock distributing circuits 13 to 16 distribute them to predetermined circuits such as flip-flops in the divided regions.

Though there is no particular limitation, the first clock distributing circuit 8 and the clock input circuits 6, 7 are coupled together through groups of clock wirings 17 and 18, and the first clock distributing circuit 8 and the second clock distributing circuits 13 to 16 are connected together through groups of clock wirings 19, 20, 21 and 22. The second clock distributing circuits 13 to 16 are connected to the circuits in the partial regions through signal lines. For instance, flip-flops 23 and 24 that are representatively shown in FIG. 1 are connected to the second clock distributing circuit 13 via clock wirings 25 and 26.

Here, the circuit cell-forming region 3 is divided into a plurality of partial regions, and the second clock distributing circuit is arranged in each of the partial regions in order to decrease the clock skew and to simplify the method thereof. In other words, the portion where the lengths and capacitances of the clock wirings are equalized to decrease the clock skew is basically placed on the side of a stage subsequent to the output of the second clock distributing circuit in order to reliably decrease the clock skew and to simplify the method thereof.

For this purpose:

(1) Delay components such as resistance components and capacitive components must be uniformalized in the clock wirings of the groups 19 to 22 connecting the first clock distributing circuit 8 to the second clock distributing circuits 13 to 16; and (2) When the clocks are input to the first clock distributing circuit 8 through the right and left clock wiring groups as shown in FIG. 1, it could be considered that the clocks are input through the clock wiring group of either side due to the specifications of the semiconductor integrated circuit. In either case, however, it becomes at least necessary to uniformalize or quantize the delay components such as resistance components and capacitive components in the clock wirings of the right and left wiring groups 17 and 18 as mentioned in (1) above, in order to quantize the delay of propagation and the allowable clock skew through the second clock distributing circuits.

To cope with the above-mentioned two points, the positions of the clock input circuits 6, 7 and of the first clock distributing circuit 8 are determined in advance and, further, the regions for forming the clock wiring groups 17, 18 are determined in advance irrespective of the kind of the semiconductor integrated circuit and the structure of logics, and the lengths of the clock wirings included in the clock wiring groups 17 and 18 are all equalized. Similarly, lengths of the clock wirings included in the wiring groups from the first clock distributing circuit 8 to the second clock distributing circuits are all equalized.

In this case, other signal lines may cross the the clock wirings. The manner of crossing varies depending upon the clock wirings, and it becomes difficult to equalize the capacitances of the individual clock wirings being affected by the capacitive components formed by the crossing wirings.

Figure 2:
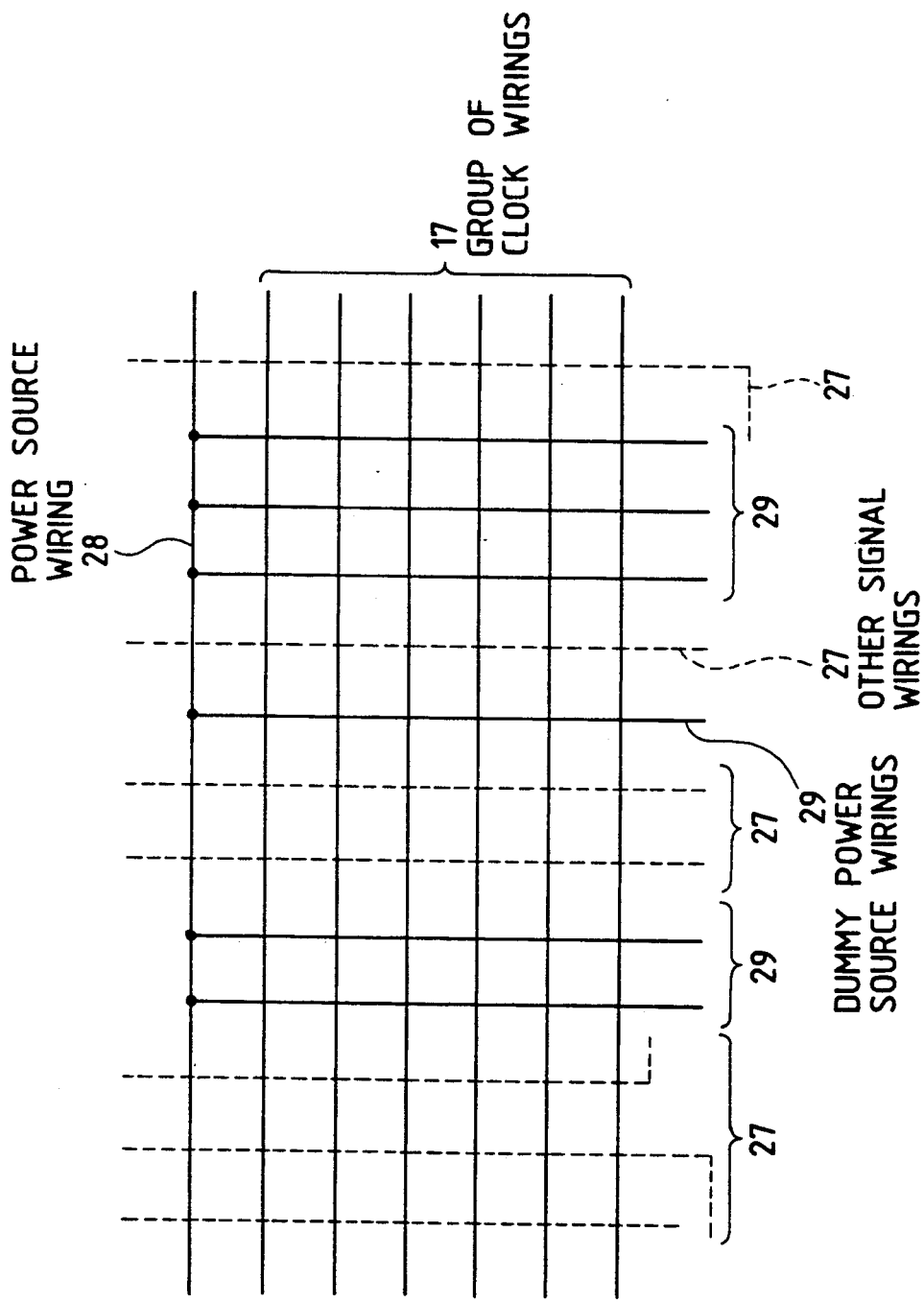
FIG. 2 is a diagram explaining a clock distributing circuit constituted to include dummy power source wirings.

To cope with this, FIG. 2 shows means for equalizing the capacitances of the clock wirings in order to uniformalize the delay components.

In FIG. 2, other signal lines 27 that cross the clock wiring group 17 are irregularly arranged as indicated by broken lines. Under such a condition, dummy power source wirings 29 connected to the power source wiring 28 are arranged in the gaps among the other signal lines 27 to cross the clock wiring group 17.

Figure 3:
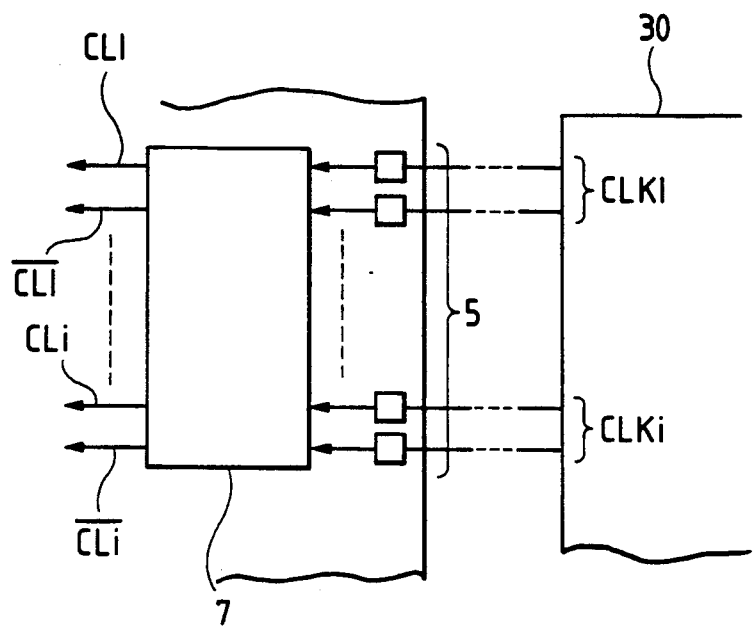
FIG. 3 is a diagram illustrating a clock signal transfer system using differential signal lines.

In the clock wiring groups connecting the clock input circuits 6, 7 to the first clock distributing circuit 8 and in the clock wiring groups 19 to 22 connecting the first clock distributing circuit 8 to the second clock distributing circuits 13 to 16, furthermore, the clock wirings that respond to a single clock signal work as differential signal lines in order to further increase the transfer speed of a change in the clock signals. As shown, for example, in FIG. 3, clock signals CLK1 to CLKi of a plurality of phases are fed as differential signals to a group of external clock input terminals 5, and are transferred from a clock input circuit 7 to a succeeding stage via differential signal lines CL1, $\overline{CL1}$ to CLi, $\overline{CLi}$. In FIG. 3, reference numeral 30 denotes a clock generator that supplies clock signals to the group of external clock input terminals 5. Such clock signals are received by the buffer of the differential input type, and the logical threshold voltage of the clock buffer assumes a level between the differential input signal levels. Therefore, the delay which is roughly one-half the delay of change of the non-inverted and inverted signals becomes a substantial delay of transfer and, therefore, the clock transfer speed increases among the clock distributing circuits and among the clock buffers. The individual clock signals output from the second clock distributing circuits 18 to 22 are transferred to the terminals via single-phase signal lines.

The first clock distributing circuit 8 has clock input buffers or clock input gates that receive clock signals having a plurality of phases fed from the clock wiring groups 17 or (and) 18, and further has clock output buffers or clock output gates to send the input clock signals to the second clock distributing circuits 19 to 22 in a distributed manner. Similarly, each of the second clock distributing circuits 19 to 22 has clock input buffers or clock input gates for receiving clock signals distributed from the first clock distributing circuit 8, and further has clock output buffers or clock output gates for distributing the input clock signals to many sequence circuits such as flip-flops in the partial regions.

Such clock distributing circuits include a number of wirings for mutually connecting a number of input/output clock gates contained therein, and it is expected that the individual internal wirings have irregular lengths to meet the positions of the clock gates to which they are to be connected. Therefore, clock skew develops even in these portions.

Figure 4:
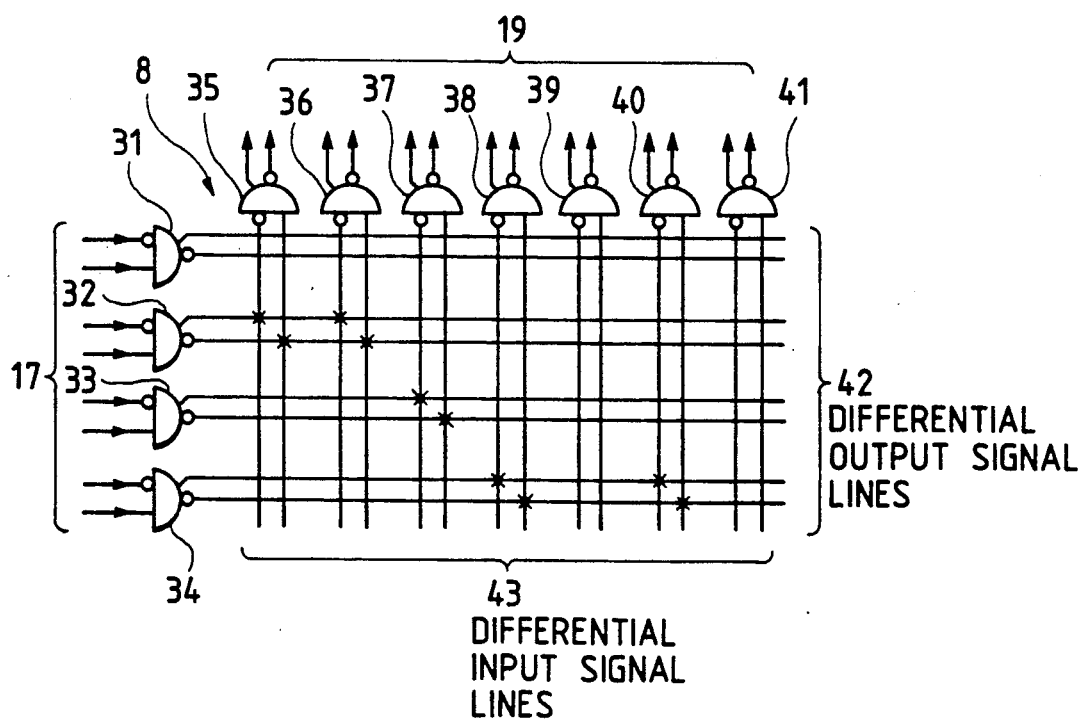
FIG. 4 is a diagram of a logic circuit in a first clock distributing circuit of FIG. 1.
Figure 5:
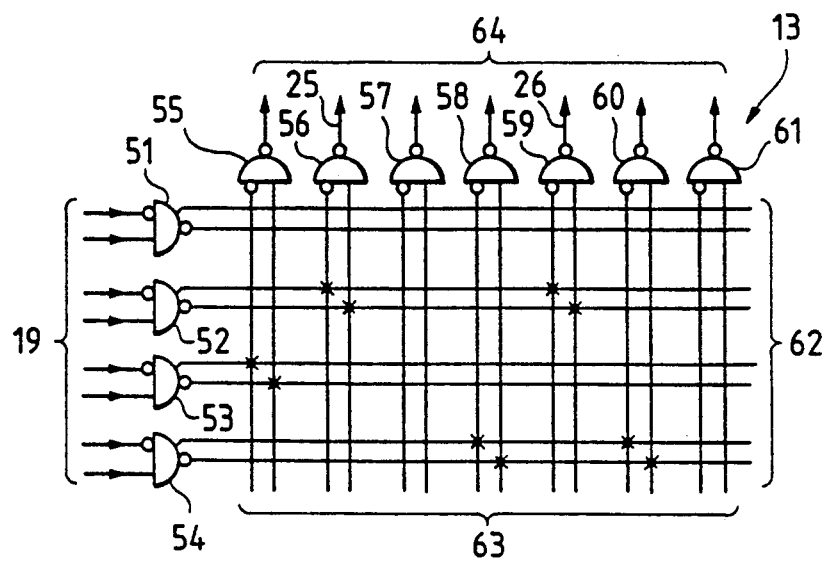
FIG. 5 is a diagram of a logic circuit in a second clock distributing circuit of FIG. 1.

Constitutions of the clock distributing circuits fabricated by giving attention to this point are shown in FIGS. 4 and 5.

FIG. 4 illustrates a circuit constitution which is about one-fourth of the first clock distributing circuit 8, and wherein reference numerals 31 to 34 denote clock input buffers that are representatively shown, and 35 to 41 denote clock output buffers that are representatively shown. The differential input terminals of the individual clock input buffers 31 to 34 are coupled to the differential signal lines included in the group of clock wirings 17 and the like, and the differential output terminals of the individual clock output buffers 35 to 41 are coupled to the differential signal lines included in the group of clock wirings 19 and the like. In the clock distributing circuit 8, the differential output signal lines 42 of the clock input buffers 31 to 34 and the differential input signal lines 43 of the clock output buffers are fixedly arranged in a crossing manner. The predetermined input signal lines 43 and output signal lines 42 are coupled together at required crossing positions indicated by, for example, a mark X through the holes, to determine the destinations for distributing the clock signals. Such crossing relationships hold even for other clock buffers that are included in the first clock distributing circuit 8 but that are not diagramed.

FIG. 5 shows the constitution of a portion of the second clock distributing circuit 13, and wherein reference numerals 51 to 54 denote clock input buffers that are representatively shown, and 55 to 61 denote clock output buffers that are representatively shown. The differential input terminals of the individual clock input buffers 51 to 54 are coupled to the differential signal lines included in the group of clock wirings 19 and the like, and the output terminals of the individual clock output buffers 55 to 61 are coupled to the group of clock wirings 64 in the final stage that includes the aforementioned single-phase clock wirings 25 and 26. In the clock distributing circuit 13, the differential output signal lines 62 of the clock input buffers 51 to 54 and the differential input signal lines 53 of the clock output buffers 55 to 61 are fixedly arranged in a crossing manner. The predetermined input signal lines and output signal lines are coupled together at required crossing positions indicated by, for example, a mark X through the holes, to determine the destinations for distributing the clock signals. Such crossing relationships hold even for other clock buffers and for other second clock distributing circuits 14 to 16 that are included in and similar to respectively the second clock distributing circuit 13 but that are not diagramed.

Figure 6:
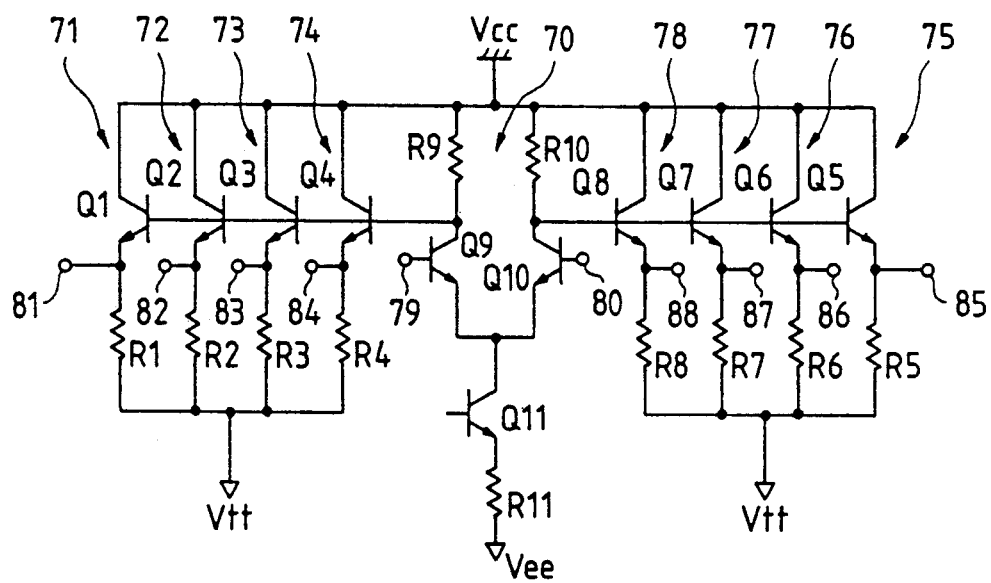
FIG. 6 is a diagram showing another circuit construction of the clock distributing circuit or a clock buffer.

FIG. 6 illustrates another example of the circuit that can be used as a clock distributing circuit or a clock buffer. In the circuit of FIG. 6, a plurality of emitter follower output circuits 71 to 74 and 75 to 78 are coupled to the inverted and non-inverted output terminals of the differential input circuit 70, and clock signals supplied from a pair of differential input terminals 79, 80 are output being distributed to four sets of differential output terminals 81, 85, 82, 86, 83, 87, 84 and 88. The differential input circuit 70 has a pair of differential input transistors Q9 and Q10 whose collectors are coupled to load resistors R9 and R10 served with a power source potential Vcc of the high-level side and whose emitters are commonly connected to a power source potential Vee of the low-level side via a constant-current transistor Q11 and a load resistor R11. The emitter follower output circuit 71 consists of an output transistor Q1 and an emitter load resistor R1 that are arranged between the power source potentials Vcc and Vtt. Likewise, other emitter follower output circuits 72 to 78 are constituted by output transistors Q2 to Q8 and emitter load resistors R2 to R8.

In the clock distributing circuit, when only some of the output terminals are to be connected to the clock wirings, the output nodes of the emitter follower output circuits that are not used, are not cut but are left under their own condition. Therefore, the electric current flows even into those emitter follower output circuits that correspond to the unused output terminals. Such a crossover current may appear to be wasteful but, in practice, contributes to preventing the clock skew. That is, if the current paths of the unused emitter follower output circuits are cut off, there develops a change in the base current or in the terminal voltage of base-emitter capacitance in the remaining emitter follower output circuits. Such a change affects the rate of change of the clock signals produced from the emitter follower output circuits. Therefore, the crossover current that flows into those emitter follower circuits corresponding to the unused output terminals works to maintain the delay components in the clock distributing circuit substantially unchanged irrespective of the output conditions thereof. Here, it needs not be pointed out that the circuit shown in FIG. 6 can also be used as a clock buffer.

Figure 7:
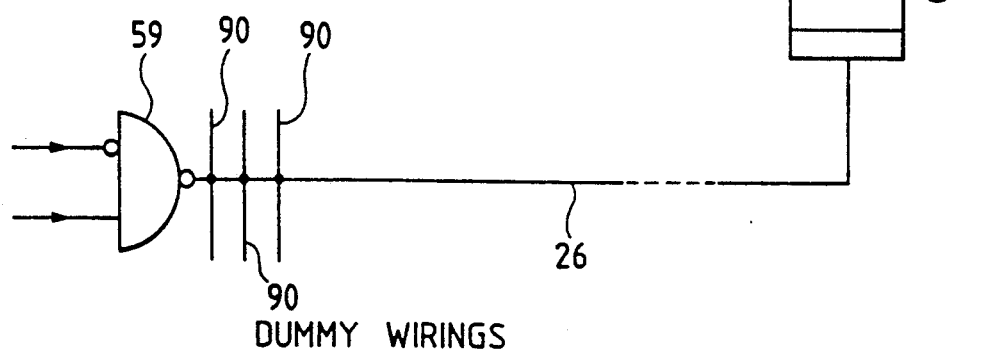
FIG. 7 is a diagram illustrating a system which utilizes dummy wirings.

FIG. 7 shows a method of individually absorbing the difference in the lengths of clock wirings.

For example, dummy wirings 90 can be coupled to the relatively short clock signal line 26 as shown in FIG. 7 in order to absorb the difference in the length of clock wirings to the flip-flops 23 and 24 that are operated in synchronism with each other as shown in FIG. 1. In this case, the dummy wirings are arranged relatively close to the output terminal of the clock driver or the clock output buffer.

The capacitive components that exist along the clock wiring can be regarded as the distributed capacity that exists along the path thereof. In order to equalize the capacitances by absorbing the difference in the length of clock wirings, dummy wirings should be coupled to the clock signal lines to trim their lengths. Here, however, the dummy wirings 90 do not substantially work as signal transfer paths. Therefore, with the dummy wirings 90 being arranged relatively close to the output terminal of the clock output buffer 59, the capacitive components increased by the dummy wirings 90 work as relatively increased delay components or work as substantial loads for the clock output buffer 59.

Next, described below is the procedure for designing the layout of a clock-feeding system in automatically arranging and wiring a semiconductor integrated circuit.

Figure 8:
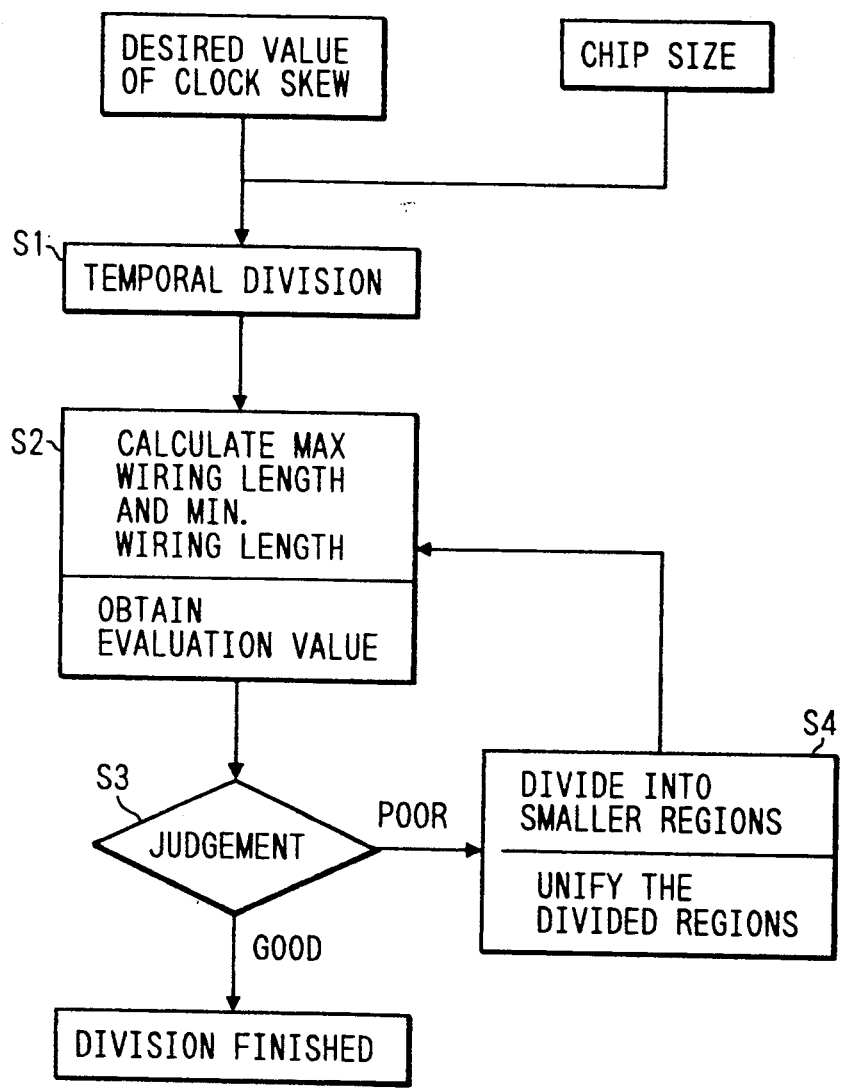
FIG. 8 is a diagram illustrating the embodiment of the whole clock wiring system by utilizing the division into partial regions and by evaluating the clock skew.

FIG. 8 shows a basic procedure therefor. The procedure shown in FIG. 8 can be carried out in an automatic arranging/writing system such as a computer system or a work station for realizing CAD or DA.

Here, though there is no particular limitation, the automatic arranging/wiring system is connected to the logic gates that constitute the semiconductor integrated circuit and to the logic file that includes logical diagram data such as logical coupling data among the gates, as well as to an LSI structure library that includes the size of the semiconductor integrated circuit, definition data such as cell regions and wiring regions, and layout rules. The automatic arranging/wiring system reads these data, and allocates various gates to the cells on an imaginary chip to constitute a required logical circuit in accordance with these data. The results of allocation to the cells are stored in an arrangement result file. When the automatic wiring is to be carried out thereafter, the data such as of arrangement result file, logic file and LSI structure library are read out, wiring paths are found among the cells according to these data, and the coordinate data thereof are stored in the wiring result file.

Though there is no particular limitation, the processing shown in FIG. 8 can be carried out concretely in parallel with the processings for both arranging the cells and determining the wiring paths, or can be carried out prior to arranging the cells or determining the wiring paths in detail.

First, described below is the latter case A desired value of clock skew and a chip size are specified by the data of the LSI structure library, and the cell region 3 is tentatively divided based thereupon (step S1). As shown, for example, in FIG. 1, the cell region 3 is imaginarily divided into four partial regions 9 to 12. At this moment, the first clock distributing circuit 8 is fixedly arranged at the central portion of the cell region, and the wiring regions for the clock wiring groups 17 and 18 are defined in advance, too. The central portions of the partial regions 9 to 12 are the regions for arranging the second clock distributing circuits 13 to 16.

Then, a maximum wiring length and a minimum wiring length of the clock wirings are determined in the partial regions 9 to 12 (step S2). The maximum wiring length can be estimated from the size and shape of the partial region and from the wiring rules. For instance, it can be regarded to be the sum of distances in the x-direction and in the y-direction from the center of the partial region to the most remote position. The minimum wiring length can be estimated from the size and shape of the second clock distributing circuit and from the wiring rules. For instance, it can be regarded to be the sum of distances in the x-direction and in the y-direction from the second clock distributing circuit to the nearest position where the cell can be formed. When it is determined in advance that the minimum wiring length is extremely smaller than the maximum wiring length, the length to which the dummy wirings are added as described in conjunction with FIG. 7 may be defined to be the minimum wiring length. In this case, however, the rule must be applied according to which dummy wirings are added to predetermined wirings among the practical wirings.

The evaluation value for the clock skew is calculated based upon the thus determined maximum wiring length and the minimum wiring length (step S2). For instance, the evaluation value Tscew is given by $$Tscew = (\alpha \cdot C_1 + R_1 \cdot C_1) - (\alpha \cdot C_2 + R_2 \cdot C_2)$$

$\alpha$; drivability of the clock buffer,
$C_1$; wiring capacitance of the longest wiring,
$R_1$; wiring resistance of the longest wiring,
$C_2$; wiring capacitance of the shortest wiring,
$R_2$; wiring resistance of the shortest wiring.

In the above equation, the first term represents a skew value of the longest wiring and the second term represents a skew value of the shortest wiring. In these terms, $\alpha \cdot C_1$ and $\alpha \cdot C_2$ are concerned with capacitive delays in relation to the drivabilities of the clock buffer circuits, and $R_1 \cdot C_1$ and $R_2 \cdot C_2$ are concerned with delays by the CR time constants of the wirings.

The thus calculated evaluation value is judged as to whether it is acceptable or not in relation to a desired value of the clock skew (step S3). The evaluation value Tscew which is as close to zero as possible is judged to be favorable. The boundary between acceptable and not acceptable has been determined in advance to a predetermined value from the viewpoint of the specifications required for the semiconductor integrated circuit and the operation speed.

When the evaluation value is favorable, the condition in which the cell region is divided is determined in its form. When the skew is too small, however, the partial regions are unified together to decrease the number of divisions (step S4) in order to optimize the dynamic specifications of the semiconductor integrated circuit or to optimize the operation speed. Though these processings need not necessarily be effected, a reduction in the number of the partial regions results in a reduction in the number of the second clock distributing circuits, which is a reduction in the area occupying the chip.

When the desired value of skew is not satisfied, the cell region is further divided into smaller regions (step S4), and the same processing is carried out followed by the judgement again.

After the number of optimum partial regions is determined through the above processing, the layout for the practical arrangement and wiring is carried out to reflect it.

The processing shown in FIG. 8 can be concretely carried out in parallel with the processings for both arranging the cells and determining the wiring paths. For instance, after the number of divisions of the partial regions is determined, the cells are arranged and, thereafter, the evaluation value is judged as to whether it is acceptable or not to determine the wiring paths. This makes it possible to proceed with the processing while highly accurately grasping the frequency of generation of the clock skews. When the number of divisions of the partial regions is to be changed, however, the number and positions of the second clock distributing circuits have to be changed, too. That is, the cells must be arranged all over again, causing the efficiency of layout processing to decrease.

According to the above-mentioned embodiment, the following effects are obtained.

(1) As shown in FIG. 2, dummy power source wirings 29 connected to the power source wiring 28 are arranged in a crossing manner in the empty regions among the signal wirings 27 that cross the clock wirings of the clock wiring group 17. The dummy power source wirings 29 arranged to cross the clock wirings help equalize the capacitances among the clock wirings without being substantially affected by the number or distributed condition of other signal wirings that cross the clock wirings whose lengths are to be equalized among the clock distributing circuits or among the clock drivers. This makes it possible to decrease or prevent the clock skew in the clock wiring groups 17 and 18 connected to the first clock distributing circuit 8 as well as to decrease or prevent the clock skew in the clock wiring groups 19 to 22 from the first clock distributing circuit 8 to the second clock distributing circuits 13 to 16.

(2) As shown in FIGS. 4 and 5, output signal lines 42(62) of a plurality of input buffers and input signal lines 43(63) of a plurality of output buffers are arranged in a crossing manner, and predetermined input signal lines and output signal lines are coupled together at required crossing positions in order to determine the distributing condition of the clock signals. In the same manner as described above, therefore, the lengths and capacitances of the internal wirings are equalized in the clock distributing circuit irrespective of the positions at which the input signal lines and the output signal lines arranged in a crossing manner in the vertical direction and lateral direction are connected together.

(3) In the constitution mentioned in (2) above, the connection relationships between the input buffers and the output buffers are arbitrarily determined depending upon the positions of contact holes for connecting the input signal lines 43(63) and the output signal lines 42(62), i.e., the connection relationships are determined maintaining flexibility irrespective of the number of phases of the input clock signals or the number of sequence circuits to which the clocks are to be distributed.

(4) As described in (1) and (2) above, it can be regarded that the clock skew does not substantially develop in the paths leading from the clock input circuits 6, 7 to the second clock distributing circuits 13 to 16 and, hence, the clock skew of the entire semiconductor integrated circuit can be quantitatively grasped. This makes it possible to simplify the method of determining the clock wirings for decreasing the clock skew. In other words, the clock skew can be easily decreased.

(5) In a plurality of emitter follower output circuits 71 to 78 having a common input shown in FIG. 6, a crossover current is permitted to flow even into those emitter follower output circuits corresponding to the unused output terminals in order to maintain the delay components substantially unchanged in the clock distributing circuits or in the clock output buffers irrespective of their output conditions. Even in this respect, therefore, the clock skew can be decreased.

(6) The clock signals are transferred in the form of differential signals among the clock distributing circuits and among the clock buffers, and whereby a delay which is roughly one-half the delay of change of the individual non-inverted and inverted signals serves as a substantial delay of transfer, making it possible to increase the clock transfer speed among the clock distributing circuits and among the clock buffers.

(7) The capacitive components that exist in the clock wirings can be regarded to be distributed capacities that exist along the paths thereof. In order to equalize the capacitances by absorbing the difference in the length of clock wirings, the dummy wirings 90 should be coupled to the clock signal lines. Here, however, the dummy wirings 90 do not substantially serve as signal transfer paths. As shown in FIG. 7, therefore, the dummy wirings 90 are arranged relatively close to the output terminals of the clock drivers, so that the capacitive components increased by the dummy wirings 90 substantially serve as loads or relatively large delay components for the clock drivers. Therefore, equalization of capacitances is promoted to cope with the difference in the length of the clock wirings, which then contributes to decreasing the clock skew.

(8) When the clock wirings are to be formed with the clock distributing circuits being arranged in their ways as shown in FIG. 1, arrangement of the clock distributing circuit is determined in the preceding stage and, then, the clock distributing circuit in the succeeding stage is arranged in each of the partial regions imaginarily divided from the whole region of the circuit, and the partial regions are further divided into smaller regions to form the clock wirings while evaluating the clock skew values of the partial regions. This makes it easy to decrease the clock skew to meet the demand for increasing the speed of operation.

In the foregoing were concretely described embodiments of the present invention accomplished by the present inventors. It should, however, be noted that the present invention is in no way limited thereto only but can be modified and altered without departing from the gist and scope of the invention.

In the embodiment shown in FIG. 1, the region was divided into four partial regions which, however, can be suitably changed in relation to a desired value of clock skew. Though FIG. 1 illustrated the embodiment which used two clock input circuits 6 and 7, it should be noted that the invention is also applicable to one which uses only one of them. There is no particular limitation in the number of phases of the clock signals fed from the external unit. Further, the clock wirings leading to the second clock distributing circuits are not limited to those of the differential type only. The clock signals need not be limited to those supplied from an external clock pulse generator but may be those produced by a generator that uses an oscillator. Furthermore, though the above-mentioned embodiments have dealt with the case where the invention was applied to the circuit such as an ECL using bipolar transistors, it should be noted that the invention is also applicable to the MOS circuit and the CMOS circuit. In this case, the emitter follower circuits are altered into source follower circuits.

The foregoing description has chiefly dealt with the case where the invention accomplished by the present inventors was adapted to a semiconductor integrated circuit in a field of art that served as the background of the invention. However, the present invention is not limited thereto only but can be widely adapted to various clock feeding systems formed on mounted substrates and wiring substrates.

Briefly described below are the effects obtained by a representative example of the invention disclosed in this application.

That is, with the dummy power source wirings being arranged to cross the clock wirings, the capacities are easily equalized among the clock wirings whose lengths should be equalized among the clock distributing circuits and among the clock drivers without being substantially affected by the number or the distributed condition of other signal wirings that cross the clock wirings, enabling the clock skew to be decreased.

Output signal lines of a plurality of input buffers and input signal lines of a plurality of output buffers are arranged in a crossing manner, and predetermined input signal lines and output signal lines are coupled together at required crossing positions in order to determine the condition for distributing the clock signals. Therefore, the lengths and capacitances of the internal wirings are equalized irrespective of the positions at which are connected together the input signal lines and the output signal lines that are vertically and laterally arranged in a crossing manner.

When the clock wirings are formed while radially arranging the clock distributing circuits, the aforementioned means are adapted to the clock wirings leading to the clock distributing circuits and to the clock distributing circuits, so that it can be regarded that the clock skew is not substantially produced in the paths leading to the clock distributing circuits. Therefore, the clock skew of the entire semiconductor integrated circuit can be quantitatively grasped to simplify the method of determining the clock wirings in a manner of decreasing the clock skew.

In a plurality of emitter follower output circuits having a common input, a crossover current is supplied to even those emitter follower output circuits that correspond to the unused output terminals, in order to maintain the delay components substantially unchanged in the clock distributing circuits and in the clock output buffers, enabling the clock skew to be decreased even in this respect.

The clock signals are transferred in the form of differential signals among the clock distributing circuits and among the clock buffers, and whereby a delay which is roughly one-half the delay of change of the individual non-inverted and inverted signals substantially serves as a delay of transfer, making it possible to increase the clock transfer speed among the clock distributing circuits and among the clock buffers.

The dummy wirings are coupled to the clock signal lines in order to equalize the capacitances by absorbing the difference in the length of the clock wirings. In this case, the dummy wirings are arranged relatively close to the output terminals of the clock drivers, so that the capacitive components increased by the dummy wirings substantially serve as loads or relatively large delay components for the clock drivers. This contributes to decreasing the clock skew under the conditions where the clock wirings have different lengths.

When the clock wirings are formed by arranging the clock distributing circuits in their ways, arrangement of the clock distributing circuit is determined in the preceding stage and, then, the clock distributing circuit is arranged in each of the partial regions that are imaginarily divided from the whole region of the circuit in the succeeding stage, and the partial regions are further divided into smaller regions to form the clock wirings while evaluating the clock skew value in each of the partial regions. This makes it easy to decrease the clock skew to meet the demand for increasing the speed of operation.

What is claimed is:

1. A clock feeding circuit comprising a first clock distributing circuit that distributes clock signals received from an external unit through clock input circuits, and a plurality of second clock distributing circuits that receive clock signals output from said first clock distributing circuit and distribute them to required circuits, wherein dummy power source wirings connected to a power source wiring are arranged in a layer over or under clock wirings connecting said first clock distributing circuit to said second clock distributing circuits, said dummy power source wirings being arranged in a manner to cross said clock wirings in empty regions among signal lines that cross the clock wirings.

2. A clock feeding circuit according to claim 1, wherein at least one of said first clock distributing circuit and said second clock distributing circuits has a plurality of input buffers and a plurality of output buffers, wherein output signal lines of the input buffers and input signal lines of the output buffers are arranged in a crossing manner, and predetermined input signal lines and output signal lines are coupled together at required crossing positions.

3. A clock feeding circuit according to claim 2, wherein the clock wirings coupled to the input terminals of said first clock distributing circuit and the clock wirings coupled to the output terminals of said first clock distributing circuit transfer the clock signals in the form of differential signals.

4. A clock wiring system, comprising a plurality of dummy power source wirings connected to a power source wiring;
an input circuit for receiving clock signals; and
a clock driver circuit having clock wirings connecting an output of the clock driver circuit to the input circuit;
wherein said plurality of dummy power source wirings are arranged to cross the clock wirings that connect the output terminals of the clock driver circuits to the input circuit that receives clock signals over said clock wirings, said dummy power source wirings being arranged in a layer over or under clock wirings in empty regions among signal wirings that cross the clock wirings.

5. A clock wiring system as claimed in claim 1, wherein at least one of the second clock distributing circuits comprises a plurality of emitter-follower output circuits having a like plurality of output nodes, some of the emitter-follower output circuits having output nodes that are connected to clock wirings, wherein the emitter-follower output circuits whose output nodes are not connected to clock wirings are maintained in circuit so that a clock signal input to said at least one of the second clock distributing circuits causes an unused crossover current to flow to the unconnected output nodes.

6. A clock wiring system comprising: a circuit region including a first clock distributing circuit that distributes clock signals received from an external unit through clock input circuits, and a plurality of second clock distributing circuits that receive clock signals output from said first clock distributing circuit and distributes them to required circuits, wherein said second clock distributing circuits are arranged in each of a plurality of partial regions divided from the circuit region such that the arrangement of the clock input circuits and the first clock distributing circuit has been determined in order to enable a first evaluation of clock skew in each of the partial regions, and wherein the partial regions are further divided into smaller regions to enable a second evaluation of clock skew when the first evaluation is judged to be poor.

7. A clock wiring system as claimed in claim 6, wherein dummy power source lines connected to a power source wiring are arranged in a layer over or under clock wirings connecting said first clock distributing circuit to said second clock distributing circuits, said dummy power source wirings being arranged in a manner to cross said clock wirings in empty regions among signal lines that cross the clock wirings.

8. A clock wiring system, comprising:
an input circuit for receiving clock signals;
a clock driver circuit for outputting clock signals from output terminals thereof to the input circuit along clock wirings; and
a plurality of dummy wirings coupled to said clock wirings at positions close to the output terminals of said clock driver circuit in a manner to cross the clock wirings, in order to substantially equalize effective lengths of the thus-crossed clock wirings to those of other clock wirings in the system.

* * * * *